United States Patent
Bellomo et al.

(10) Patent No.: US 6,538,479 B2
(45) Date of Patent: Mar. 25, 2003

(54) POWER SWITCH DRIVER CIRCUIT HAVING CROSS-COUPLED BUFFER CIRCUITS

(75) Inventors: Ignazio Bellomo, Ponte Sesto Rozzano (IT); Giulio Corva, Valdagno (IT); Francesco Villa, Gorgonzola (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/942,110

(22) Filed: Aug. 28, 2001

(65) Prior Publication Data

US 2002/0030516 A1 Mar. 14, 2002

(30) Foreign Application Priority Data

Aug. 29, 2000 (IT) .......................................... MI00A1922

(51) Int. Cl.[7] ................................................. H03K 3/00
(52) U.S. Cl. ....................... 327/108; 327/112; 327/391; 327/437
(58) Field of Search ................................ 327/108, 109, 327/110, 111, 112, 376, 377, 387, 389, 391, 434, 437; 326/85–87, 90, 91

(56) References Cited

U.S. PATENT DOCUMENTS

| | | | | |
|---|---|---|---|---|
| 5,281,862 A | * | 1/1994 | Ma | 327/108 |
| 5,349,243 A | * | 9/1994 | McClure | 327/108 |
| 5,481,213 A | * | 1/1996 | Johnson | 327/108 |
| 5,486,782 A | * | 1/1996 | Chan | 327/112 |
| 5,686,859 A | * | 11/1997 | Majumdar et al. | 327/530 |
| 5,760,620 A | * | 6/1998 | Doluca | 327/112 |
| 5,796,277 A | * | 8/1998 | Kim et al. | 327/108 |
| 5,831,458 A | * | 11/1998 | Nakagawa | 327/108 |
| 5,883,538 A | * | 3/1999 | Keeth et al. | 327/333 |
| 6,037,811 A | * | 3/2000 | Ozguc | 327/108 |

FOREIGN PATENT DOCUMENTS

EP 1 094 606 A1 4/2001

* cited by examiner

Primary Examiner—Timothy P. Callahan
Assistant Examiner—Hai L. Nguyen
(74) Attorney, Agent, or Firm—Lisa K. Jorgenson; Robert Iannucci; Seed IP Law Group PLLC

(57) ABSTRACT

A driver circuit drives at least one power switch, which circuit comprises a final stage including a complementary pair of power transistors connected to said switch at a common output node. Advantageously, this circuit comprises a respective power-on buffer stage, connected in upstream of each of the power transistors, and a power-on detector associated with each power transistor, the detector associated with one of the power transistors being connected to the buffer stage of the complementary one of the transistors to prevent the power transistors from being turned on simultaneously.

16 Claims, 9 Drawing Sheets

POWER SWITCH DRIVER CIRCUIT HAVING CROSS-COUPLED BUFFER CIRCUITS

BACKGROUND OF THE INVENTION

1. Field of the Invention

The present invention relates to a driver circuit, useful to drive a power switch incorporated in a voltage regulator of the switching type.

More particularly, the invention relates to a driver circuit for driving at least one power switch and comprising a final stage that includes a complementary pair of power transistors connected to a control input of said power switch at a common output node.

2. Description of the Related Art

Voltage regulators of the switching type are widely utilized in many applications on account of their action being effective and accurate. The basic components of a regulator of this type are: one or more power switches, a driver for driving each power switch, passive energy storage elements (capacitors, coils), and a (power management) controller for the control voltage of the driver.

In most of the applications, the power switches are formed of discrete components, such as field-effect power transistors, whereas the controller and the drivers are integrated circuits. The drivers and the controller may either be included in the same integrated circuit or in two separate integrated circuits.

By providing discrete power switches, different technologies can be used and optimized to fill individual demands. For example, the aim of the switches is the one of minimizing switching and conduction losses, whereas the one of the controller and the drivers is the one of using a broad range of integrated components can be used.

It is essential to the overall system efficiency that the power switches be driven in an optimum manner, meaning that in general it should be possible to turn them on/off at a high speed using all the available voltage. This is true in particular for the so-called hard switching systems.

A problem that is often encountered in the design of driver circuits is that supply voltages (VCC) must be used that are optimized for the power switches but not for the components available to make the drivers.

More generally, the problem that must often be addressed is the one of how to produce fast and efficient drivers, which can operate on higher supply voltages than the highest supply voltages accepted by the devices in which they are incorporated.

A typical example of a power switch driver is shown in FIG. 1 of the accompanying drawings. Such driver 1 comprises: a level translator 2 for translation from a first logic voltage, e.g. of 3.3V or 5V, to a power supply voltage VDRV; a pre-driver stage 3 that is referenced to the supply voltage VDRV; and two power switches 4 and 5 operative to respectively close and open an external power switch Mext.

As it is shown in FIG. 2, the power switches 4, 5 may be MOSFET transistors. In particular, the MOSFET transistor for turning on the external switch Mext may be a P-channel transistor M1, and that for turning off the same external switch may be an N-channel transistor M2.

The external switch Mext usually has a high capacitive load, so that to have it turned on and off rapidly, the transistors M1, M2 have to be large ones in order to deliver and/or take in high current peaks. The pre-driver stage, in its turn, should be adequately dimensioned to drive large MOS transistors with high capacitances.

The pre-driver stage 3 is to quickly turn on/off the transistors M1 and M2 in complementary manner to avoid cross-conduction, i.e. prevent M1 and M2 from being simultaneously conductive during the switchings. Also, the stage 3 should keep power consumption down, at the same time as it should limit the control voltages of the switches 4 and 5, as well as of all of its components.

Commercially available regulators mostly use a discrete N-channel MOS transistor as a power switch, since it can easily be driven in a simple manner.

A straightforward solution is provided by the embodiment of FIG. 3, where a driver formed of a succession of inverters 7, 8, 9, of progressively larger size is shown. This structure is known as a "horn", and has an advantage in that it is extremely fast and inherently overcomes the cross-conduction problem. Unfortunately, to provide the power MOS transistor with sufficient overdrive to lessen its conduction resistance, the supply voltage to the driver has to be selected above the highest gate-source voltage of the MOS transistors in the inverter.

A prior technical solution allowing the driver to be supplied a higher voltage than the maximum gate-source voltage is illustrated by the schematic of FIG. 4. This prior solution provides separate drives for the transistors M1 and M2, respectively. Here again, the drive should be appropriate to avoid cross-conduction. The drive signal, moreover, is transferred by turning on/off certain current generators 10 and using clamping structures 11 to limit the gate-source voltage of the power transistor. The difficulty lies here in the static draw of the clamping structures 11 and the signal transfer speed being interlinked. For fast turning on and off, the currents from the generators 10 must be large, and these currents are statically absorbed by the clamping structures 11 after the transition.

Turning off the transistors M1, M2 is far more easily effected than turning them on. The gates and sources of the transistors M1 and M2 may be simply short-circuited through an additional MOS transistor 13, that has much smaller dimensions than the ones of the previous M1 and M2. This additional transistor is in its turn driven by a clamping generator 12, but with a much smaller current than that used for turning on the transistors M1 and M2.

To avoid cross-conduction, the power-on and power-off signals may be phase shifted by means of fixed delay blocks 14, 15, as shown in FIG. 5.

A major disadvantage of this prior solution is that the delays must be stretched to prevent malfunction due to process spread and changes in the working conditions.

Shown schematically in FIG. 6 is another prior solution wherein the power-on signals to the transistors M1 and M2 are conditioned logically, each according to the state of the other of the transistors, M2 and M1.

Not even this prior solution can be very effective when the drivers are supplied a low voltage to allow standard logic gates 16 to be used, for otherwise the circuits would become excessively complicated.

An improvement on the last-mentioned solution is disclosed in the European Patent Application No. 99830666.6, in the name of STMicroelectronics S.r.l., wherein a large current is used for turning on/off the transistors M1 and M2. This current is reduced after switching. However, the pre-driver stage 3 is to supply a current throughout the charge/ discharge phase of the gate of the external transistor Mext, as well as during the phase of charging/discharging the gates of transistors M1 and M2, due to a parasitic capacitor forming between the gate and the drain of each transistor, M1 and M2.

Thus, the current in this prior solution is not reduced immediately after having charged the gates of the transistors M1, M2, but rather after a predetermined time lapse, taken to be adequate to ensure completion of the transition at the driver output. This is schematically shown in the embodiment of FIG. 7.

The current loop is digitally implemented, i.e. a digital count starts as soon as current is flowed through the clamp of transistor M1, the current being reduced at the end of the count. This solution, therefore, becomes critical wherever the external transistor Mext is a component unknown beforehand, and involves excessive time and power consumption.

A further attempt at solving the driving problems mentioned above is illustrated schematically by the embodiment of FIG. 8. The signal transition is effected by driving a small current generator 17 and a clamp, the latter driving a buffer in the form of an operational amplifier 18, e.g. a compensated two-stage Miller amplifier.

Not even this prior solution is devoid of drawbacks as regards the switching speed of the operational amplifier, which speed is limited by the SR on the Miller compensation capacitor.

Here again, power-off can be readily obtained by means of a small switch toward ground or the supply. Consequently, a buffer used for driving the transistors M1 and M2 into the 'on' state has usually to be asymmetrical, and will be turned on or enabled only during the power-on phases.

BRIEF SUMMARY OF THE INVENTION

An embodiment of this invention provides a novel driver circuit, particularly for a power switch, with appropriate structural and functional features to overcome the aforementioned drawbacks of the prior art.

Briefly, the driver circuit ensures high speed for the power-on and power-off edges, minimizes power consumption, and avoids stressing the gate of the power transistor.

The driver circuit associates, with each power transistor in the complementary pair, a respective power-on buffer stage, each buffer stage being enabled by the 'off' state of its complementary transistor.

This approach allows the transistors of the output stage to be turned on with no limitations on current and with a short delay time.

The features and advantages of a driver circuit according to the invention will be apparent from the following description of an embodiment thereof, given by way of non-limitative example with reference to the accompanying drawings.

DETAILED DESCRIPTION OF THE INVENTION

Figure 1:
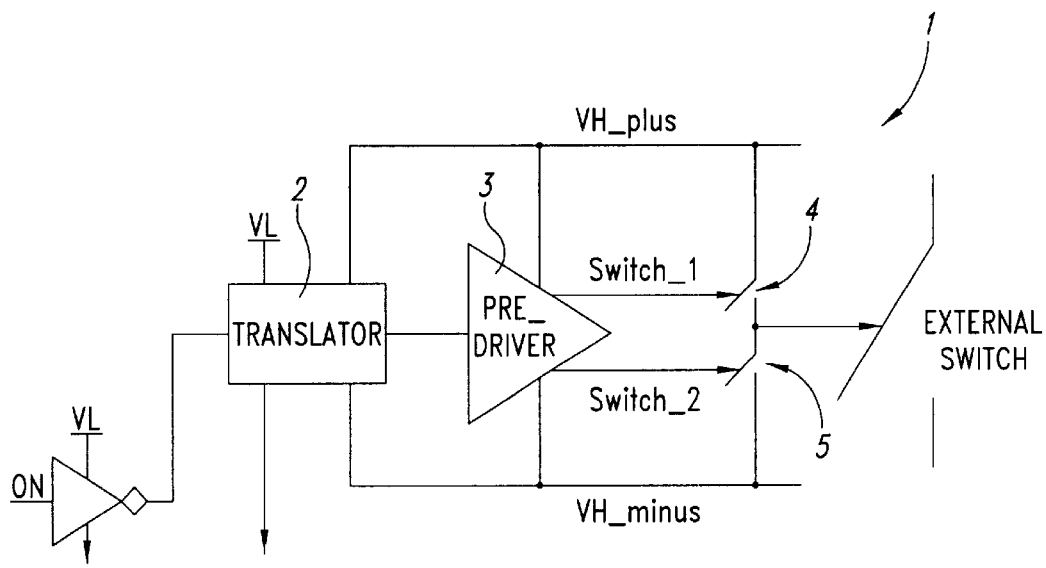
FIG. 1 shows a schematic view of a power switch driver according to the prior art.
Figure 2:
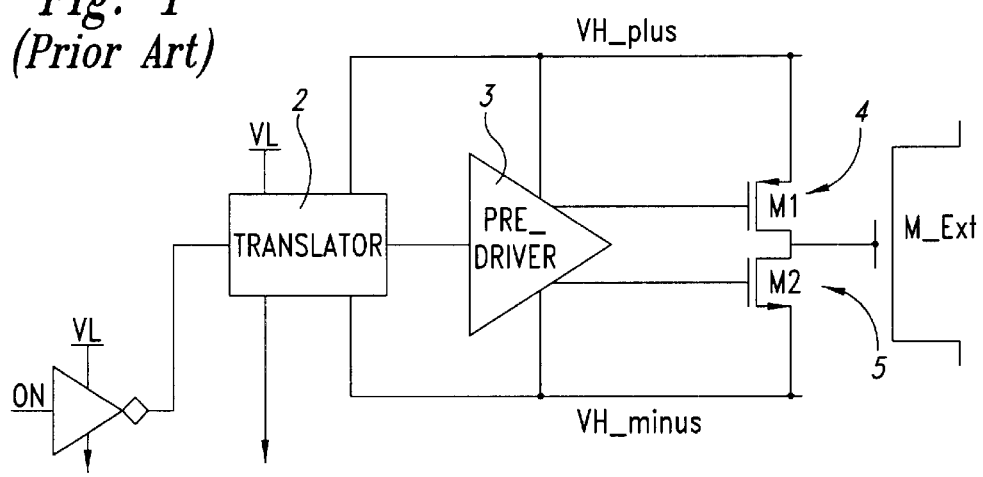
FIG. 2 shows a schematic view of the driver circuit of FIG. I in further detail.
Figure 3:
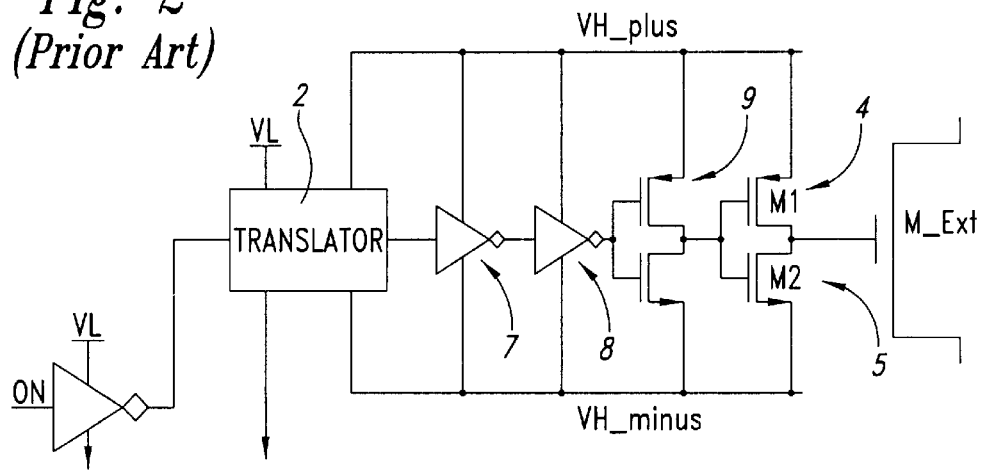
FIG. 3 shows a schematic view of another conventional power switch driver.
Figure 4:
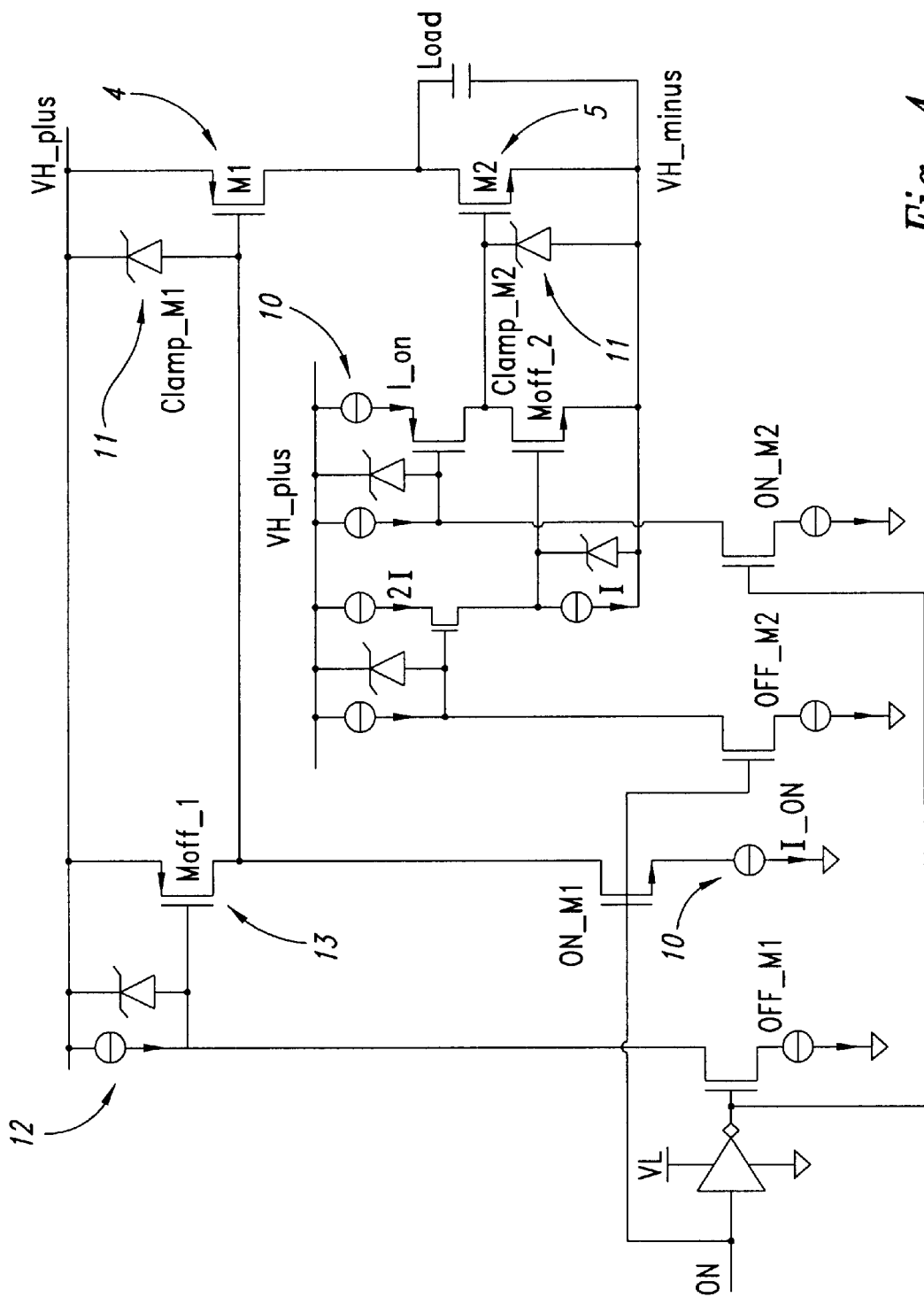
FIG. 4 shows a schematic view of a further conventional driver circuit.
Figure 5:
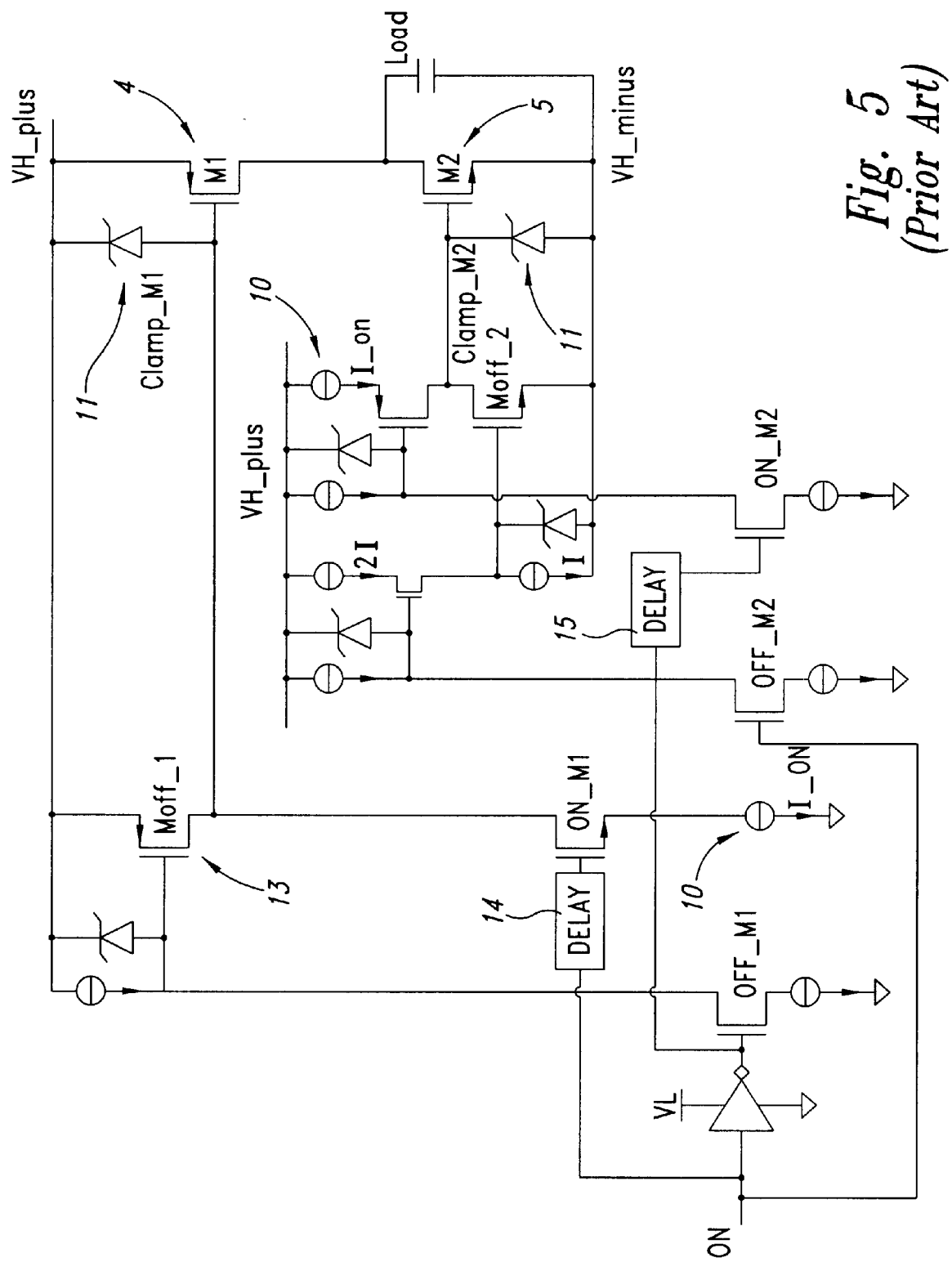
FIG. 5 shows a schematic view of an improvement in the design of FIG. 4.
Figure 6:
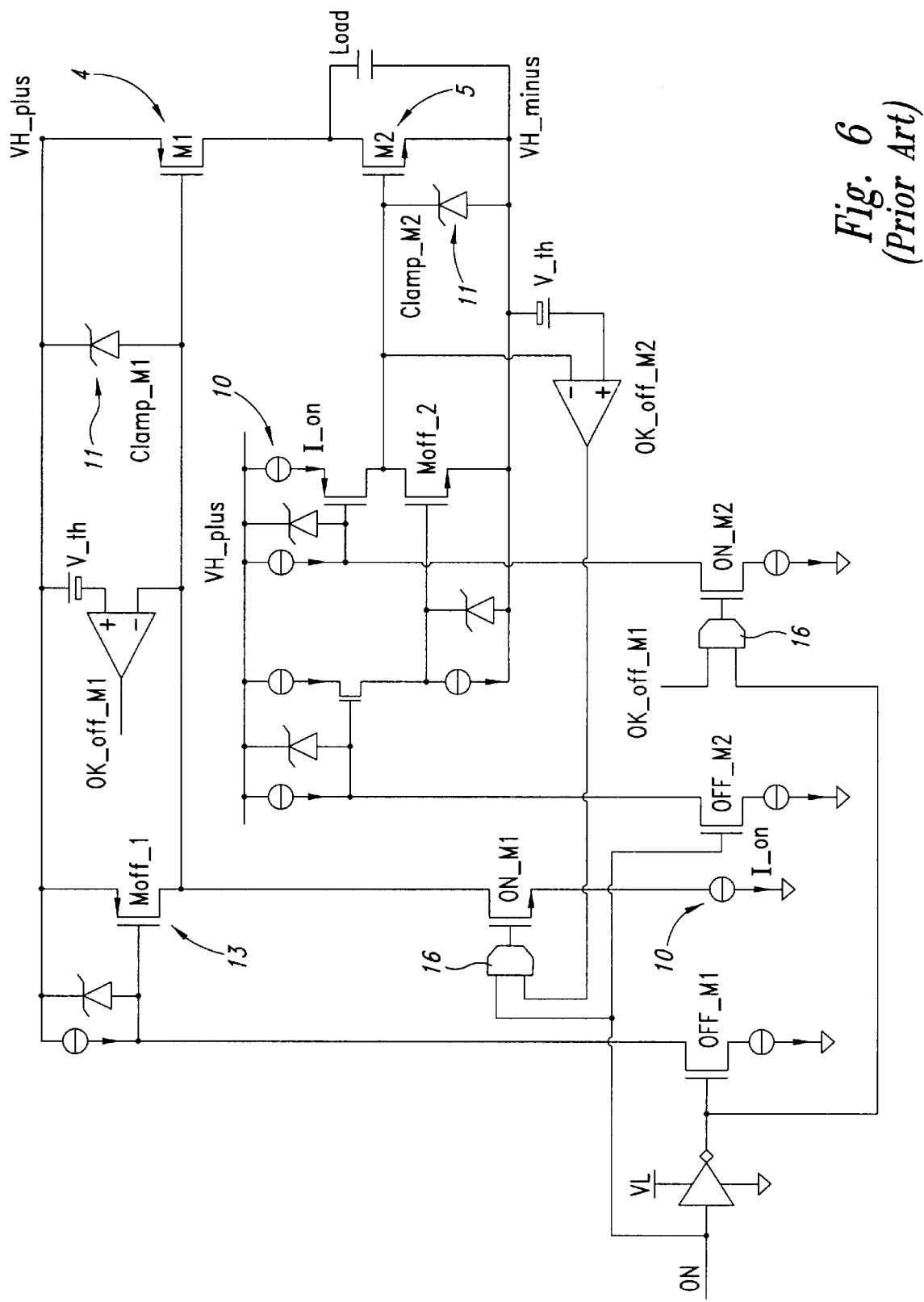
FIGS. 6, 7 and 8 show a schematic view of respective conventional power switch drivers.
Figure 7:
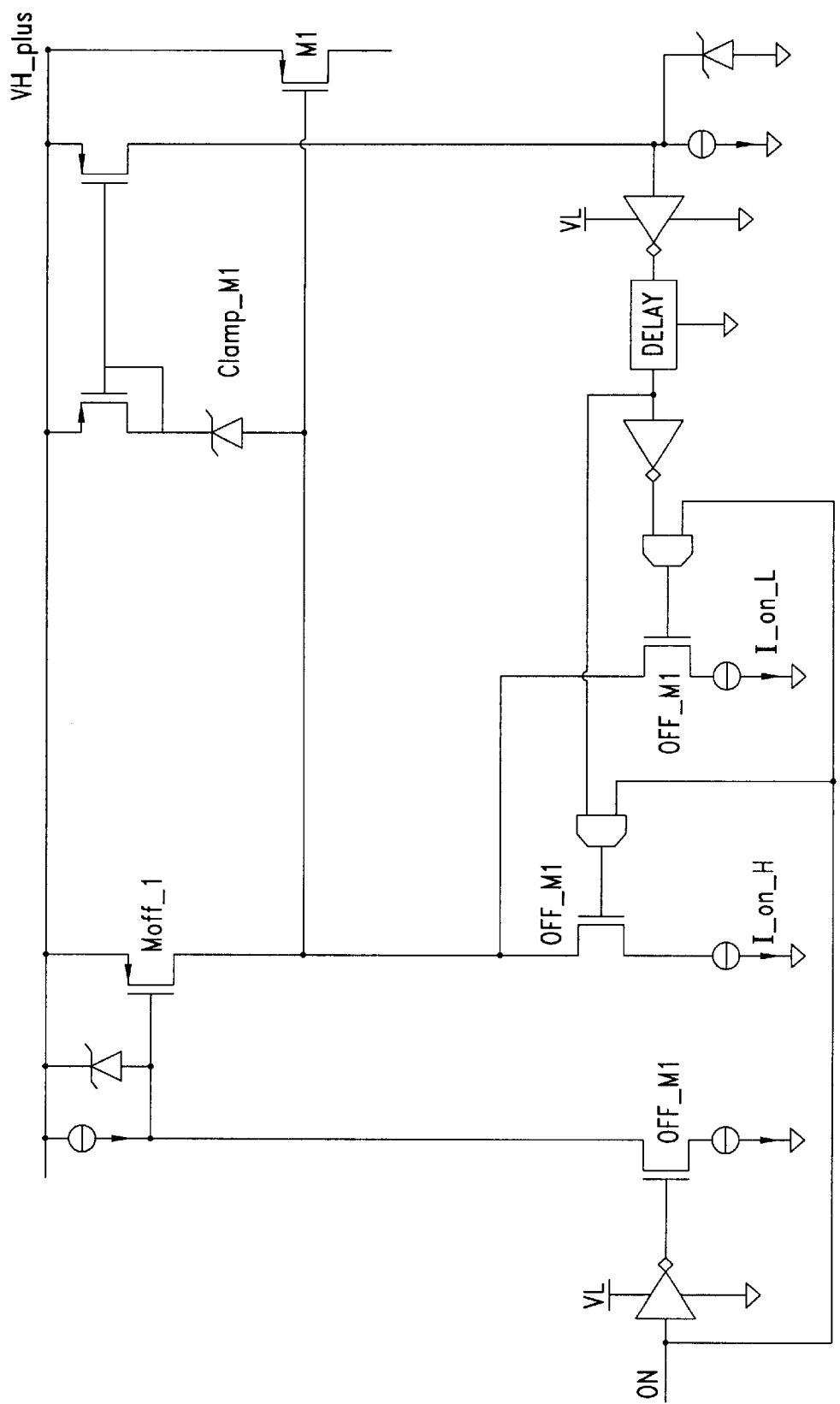
Figure 8:
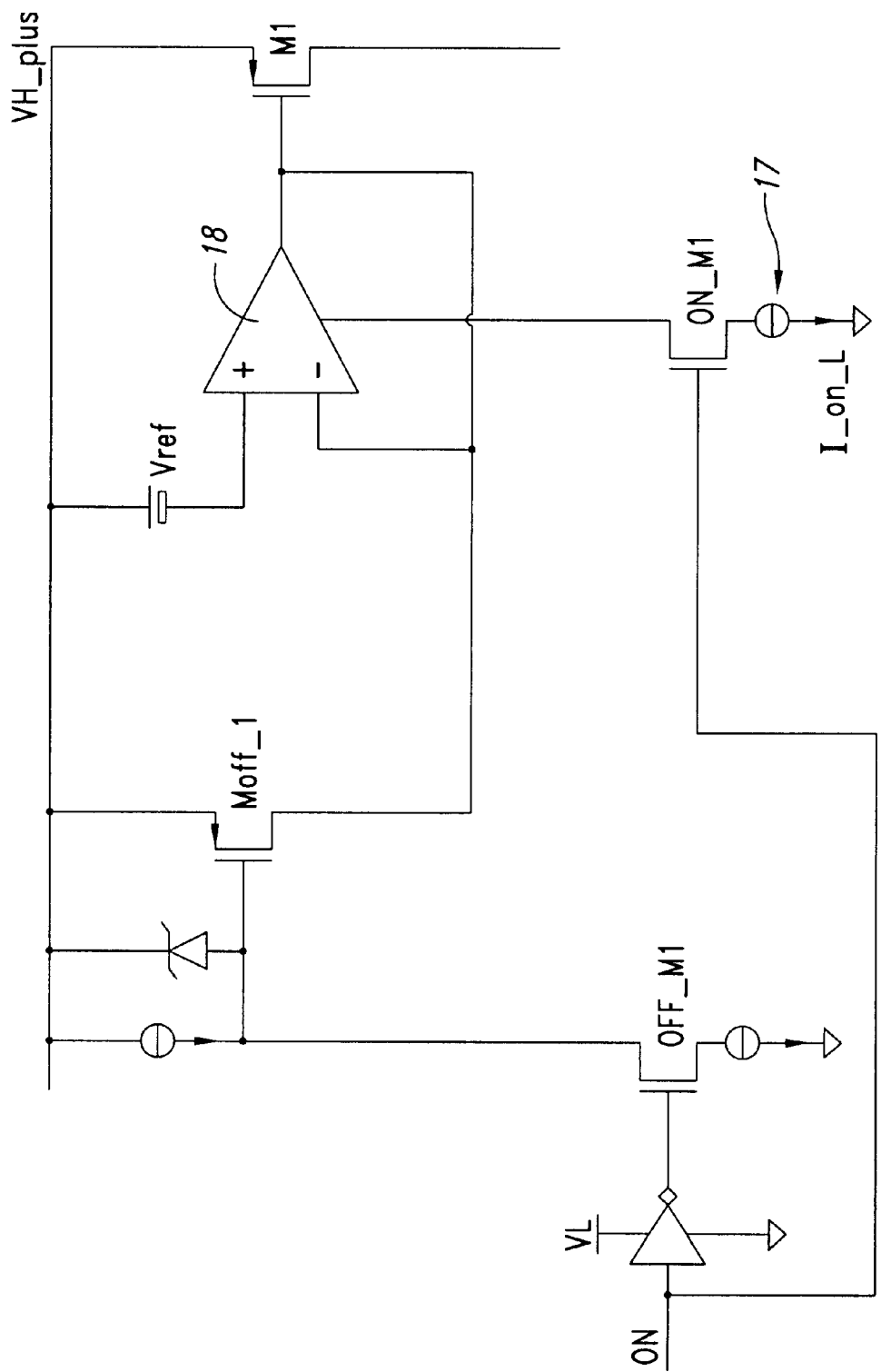
Figure 9:
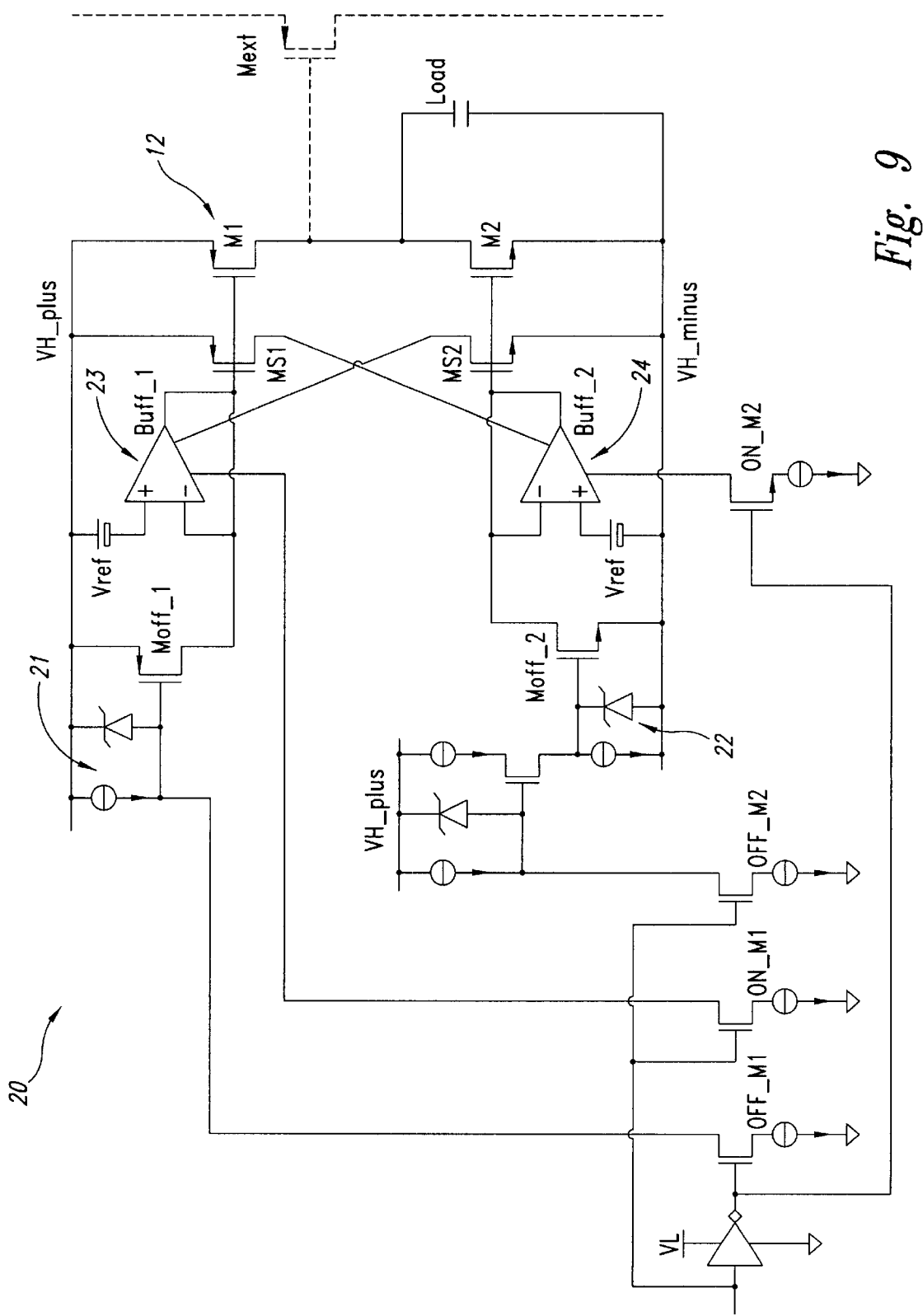
FIG. 9 shows a schematic view of a driver circuit according to the invention.

With reference to the drawing views, in particular to the embodiment shown in FIG. 9, a driver circuit according to the invention is generally shown at 20 in schematic form and is useful to drive a power switch, e.g. a MOS power transistor Mext outside the circuit.

More particularly but not exclusively, the circuit 20 is used to drive a power transistor that is incorporated in a switching type of voltage regulator.

The driver 20 includes an output stage 12 comprising a complementary pair of power transistors M1 and M2 being connected, at a common node OUT, to the gate terminal of the external transistor Mext and adapted to charge and discharge the external transistor Mext.

Provided upstream of each of the transistors M1, M2 is a respective power-on buffer stage 23, 24, also referenced Buff1, Buff2. In other words, the buffers Buff1 and Buff2 are buffers for turning on M1 and M2, respectively.

Connected in parallel with each of the buffer stages, Buff1 and Buff2, is a respective transistor, Moff1 and Moff2, for turning off the power transistors M1 and M2.

Connected to the power transistors M1 and M2 respective power-on detectors consisting, preferably, of a sense transistor, Ms1 and Ms2. This detector is structured to detect the power-on state of a corresponding one of the power transistors, M1 or M2, and pass the information to the buffer stage, 23 or 24, associated with the other of the power transistors. In this way, the transistors M1 and M2 cannot be turned on simultaneously.

The power-off transistors Moff1 and Moff2 are relatively small, and can be turned on by means of passive clampers, shown at 21 and 22 in the Figure. However, it is not necessary to control their output current because this would be nulled (Vds=0) once the transition is over.

The buffers Buff1 and Buff2 are driven by means of an enable current 1, the buffers Buff1 and Buff2 being complementary of each other.

Advantageously, the MOS sense transistor Ms1 is connected to the buffer Buff2 and prevents this complementary buffer Buff2 from being turned on while the transistor M1 is 'on'.

Likewise, the sense MOS transistor Ms2 is connected to the buffer Buff1 and prevents this complementary buffer Buff1 from being turned on while the transistor M2 is 'on'.

The residual current in the transistor M1, allowing the buffer Buff2 to be turned on, is dependent on the dimensional ratio of the transistors M1 and Ms1, and on the construction of the buffer Buff2.

Likewise, the residual current in the transistor M2, allowing the buffer Buff1 to be turned on, is dependent on the dimensional ratio of the transistors M2 and Ms2, and on the construction of the buffer Buff1.

Figure 10:
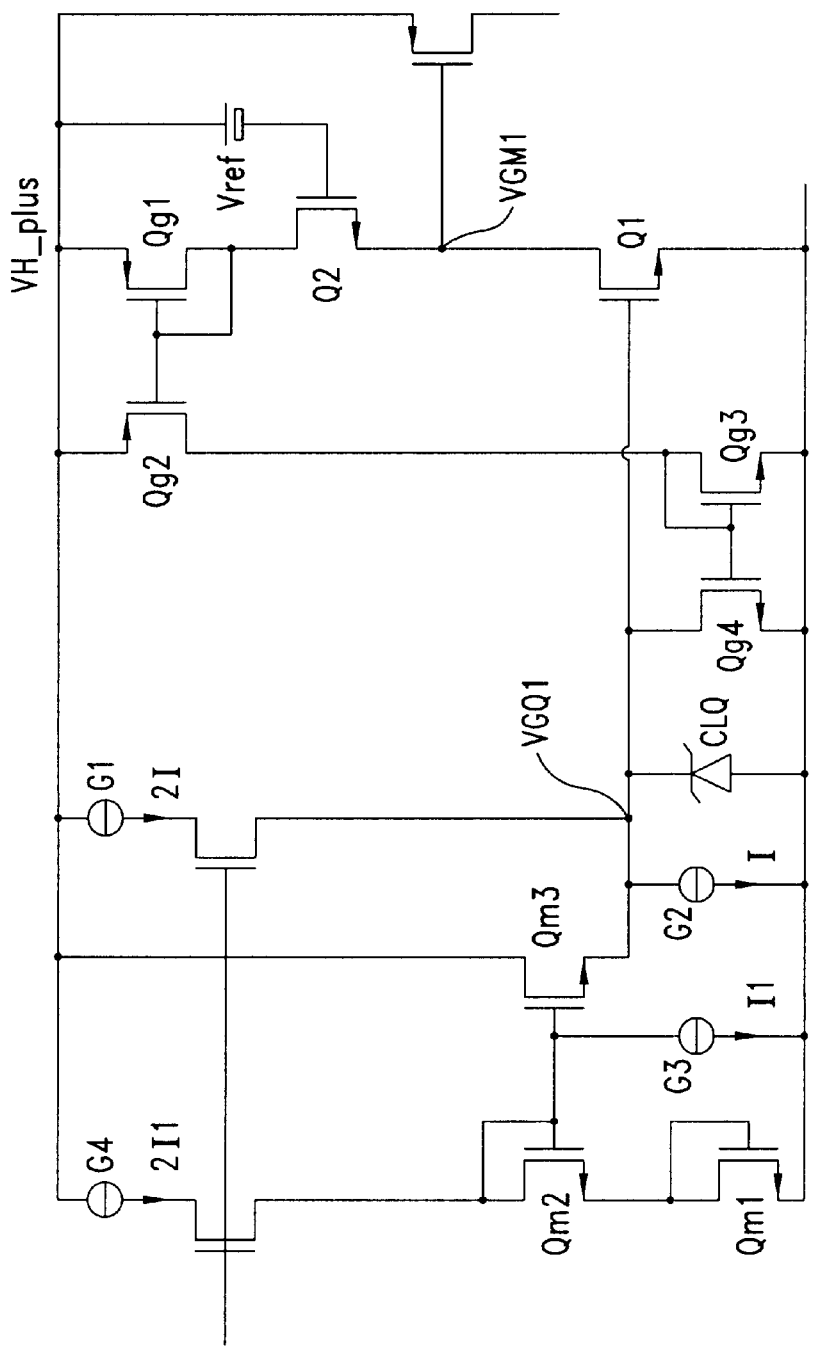
FIG. 10 shows a schematic view of a detail of the circuit of FIG. 9.

A general diagram of the buffer Buff1, 23, is shown in FIG. 10. The basic components of the buffer 23 are the following:

an output MOS transistor Q1 connected to turn on the transistor M1;

a generator G1 generating a current 2I, which may be regarded as a pull-up current, adapted to turn on the transistor Q1;

a generator G2 generating a pull-down current I;

a damper CLQ connected to the gate terminal of the transistor Q1;

a generator for generating a reference voltage Vref, and an error amplifier, represented by the transistor Q2, for computing the difference between an output voltage and a clamping voltage sought;

a generator G3 generating a pull-down current I1;

a generator G4 generating a current 2I1;

a translinear link comprising transistors Qm3, Qm2 and Qm1, and a pair of current mirrors comprising respective transistors Qg1, Qg2 and Qg3, Qg4.

While the transistor M1 is 'off', the buffer 23 is also 'off'. During this power-off phase, the control generator G1 is 'off', the other generator G2 holding the transistor Q1 in the 'off' state.

Likewise, the generator G4 is 'off' and the other generator G3 holds all the translinear link transistors Qm1, Qm2, Qm3 in the 'off' state.

With the generator G1 turned on, the transistor Qm3 is 'off', and the gate of the output transistor Q1, i.e. the node at a potential VGQ1, goes up. The output transistor Q1 draws a large current from the output node, quickly turning on the power transistor M1.

The generator G4 is turned on concurrently with the generator G1, so that the diode-connected MOS transistors, represented by Qm1 and Qm2, are caused to conduct. As the gate of the transistor M1, i.e. the node at a potential VGM1, drops with respect to the supply voltage by an amount equal to the voltage Vref plus the threshold voltage of the transistor Qm3, the transistor Q2 goes 'on' and closes the feedback. The controlled quantity is a voltage Vgs(M1).

The drain current of the transistor Q2 is mirrored by the mirror comprising the transistors Qg1, Qg2 and by the other mirror comprising the transistors Qg3, Qg4, thus bringing the potential VGQ1 down and causing the transistor Qm3 to conduct.

The buffer circuit 23 attains equilibrium when the sum of the currents at the node VGQ1 is zero. In equilibrium, the transistor Qm3 is turned on. The currents I1 and I, and the dimensions of the MOS transistors Qm1, Qm2, Qm3, Q1, Qg1, Qg2, Qg3 and Qg4 may be selected to satisfy the following relation:

$$Id(Qm3)=Id(Qg4)=I1$$

The current Id(Q1) equals Id(Q2) and is the same order of magnitude as the current I1, which is much smaller than the inrush current of Q1. Voltage VGQ1 is lower than the operating voltage of the damper CLQ, which is therefore held 'off'.

The damper CLQ is only used at power-on, before the feedback comes into effect, to protect the gate-source of the output transistor Q1.

The transistor Q2 also functions as a damper on the voltage drop Vgs(M1) before the feedback comes into effect.

The construction of the buffer stage 23 includes two gain nodes VGM1 and VGQ1. With the transistor Qm3 turned on, the impedance at the node at potential VGQ1 is sure to be low and the corresponding pole sufficiently high to ensure stability.

By having no compensating capacitors connected to the node at potential VGQ1, the buffer 23 will exhibit a high slew rate and be very fast.

Figure 11:
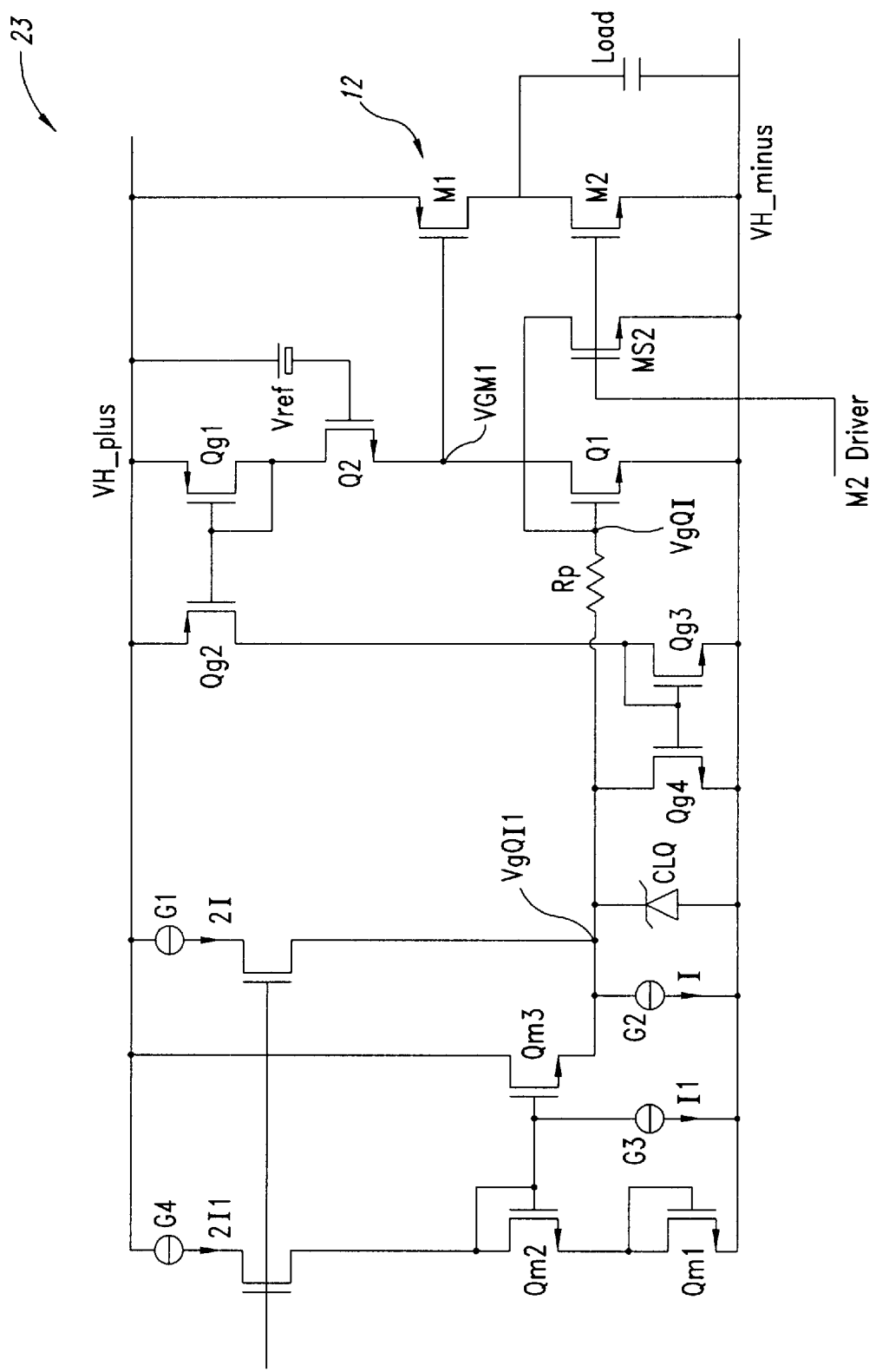
FIG. 11 is another detail view of FIG. 10.

As a safeguard against cross conduction, a resistor Rp is connected, as shown in FIG. 11, between the node at potential VGQ1 (gate of Q1) and the node at potential VGQI1 (connected to the linear link).

Advantageously, the drain of the sense transistor Ms2 is connected to the node at potential VGQ1, as clearly shown in FIG. 11.

When the buffer 24 is turned on, and the transistor M2 is still 'on', VGQ1=0 and the resistor Rp will limit the current through the transistor Qm3.

In this situation, it is:

$$Id(Ms2)=I+Id(Qm3)$$

and this value multiplied by the dimensional ratio of M2 to Ms2 gives the maximum cross-conduction current in the power transistors M1 and M2.

The above considerations hold true also for the buffer 24 associated with the sense transistor Ms1. The construction of the buffer 24 is the same as that of the buffer 23 discussed hereinabove except that the polarities of the elements are reversed because the power transistor M2 driven by the buffer 24 is complementary to the power transistor M1 driven by the buffer 23. Accordingly, the buffer 24 will be no further described.

The buffer 23 shows certain oscillations concurrently as the output voltage VOUT goes up. In this situation, the Miller capacitor of the transistor M1 is being charged, and the transistor Q1 is to supply the necessary current. The loop of buffer 23 may show some instability if the supply current is much larger than the equilibrium current. However, the oscillations are harmless because the current from the transistor M1 is unidirectional and cannot discharge the gate of the external power transistor Mext. The amplitude of these oscillations is greater at the node at potential VGQ1, and is near-monotonic at the node at potential VGM1, the output voltage VOUT being actually monotonic.

The driver circuit 20 offers a number of advantages, of which the fact that high switching speeds can be achieved at a reduced overall power consumption of the circuit is foremost.

Furthermore, the gate terminal of the power transistor is protected in a more effective manner and with less problems of reliability.

The power consumption of the driver circuit, moreover, is unrelated to the size of the switch.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

We claim:

1. A driver circuit for driving a power switch, the circuit comprising:

a final stage including a complementary pair of power transistors connected to said switch at a common output node; and a pair of power-on buffer stages connected respectively to said power transistors, each buffer stage including a clamper coupled to a power-on detector associated with a corresponding one of said power transistors, and a first pull-down current generator, the first pull-down current generator and the damper being connected in parallel between gate terminal of an output transistor and a voltage reference, the power-on detector associated with one of said power transistors being connected to the buffer stage of the complementary one of the power transistors to prevent said power transistors from being turned on simultaneously.

2. A driver circuit according to claim 1, wherein said power-on detector is a sense transistor.

3. A driver circuit according to claim 2, wherein said sense transistor is a MOS transistor having a drain terminal connected to the buffer stage associated with the complementary one of the power transistors.

4. A driver circuit according to claim 3, wherein each of said buffer stages comprises an output transistor connected to turn on a corresponding one of the power transistors and said drain terminal is connected to the gate terminal of said output transistor of said buffer stage associated with the complimentary one of the power transistors.

5. A driver circuit according to claim 1, wherein each of said buffer stages comprises an output transistor connected to turn on a corresponding one of the power transistors, and comprises a current generator adapted to turn on said output transistor.

6. A driver circuit according to claim 1, wherein one of the buffer stages includes two gain nodes.

7. A driver circuit according to claim 6, wherein each buffer stage further includes:
   a generator for generating a reference voltage and an error amplifier, said error amplifier being connected to said output transistor to compute a difference between an output voltage at said output node and a clamping voltage based on the reference voltage;
   a second pull-down current generator coupled to said first pull-down current generator;
   a further current generator coupled to said power-on current generator;
   a translinear link comprising a set of transistors; and
   a pair of current mirrors interconnecting said link and said error amplifier.

8. A driver circuit according to claim 7, wherein the buffer stage includes a cross-conduction preventing resistor connected in between a gate terminal of the output transistor and the translinear link of said buffer stage.

9. A driver circuit for driving a power switch, the circuit comprising:
   a complementary pair of first and second power transistors connected between first and second voltage references and connected to each other and to the power switch at a common output node, each of the power transistors having a control terminal;
   first and second power-on buffer stages connected respectively to the control terminals of the first and second power transistors, the first power-on buffer stage including a first output transistor connected between the control terminal of the first power transistor and the second voltage reference, a first current generator connected between the first voltage reference and a control terminal of the first output transistor, a second current generator, and a clamper, the second current generator and damper being connected in parallel between the control terminal of the first output transistor and the second voltage reference;
   a first power-on detector connected between the first power transistor and the second power-on buffer stage; and
   a second power-on detector connected between the second power transistor and the first power-on buffer stage, the power-on detectors thereby preventing the power transistors from being turned on simultaneously.

10. The driver circuit of claim 9, wherein each buffer stage includes:
    a second output transistor connected between the first voltage reference and the control terminal of the first power transistor;
    a link transistor connected between the first voltage reference and the control terminal of the first output transistor; and
    a third current generator connected between a control terminal of the link transistor and the second voltage reference.

11. The driver circuit of claim 9, wherein each of the power-on detectors includes a sense transistor.

12. The driver circuit of claim 9, wherein each buffer stage includes a resistor connected between the control terminal of the output transistor and the second current generator.

13. A driver circuit for driving a power switch, the circuit comprising:
    a complementary pair of first and second power transistors connected between first and second voltage references and connected to each other and to the power switch at a common output node, each of the power transistors having a control terminal;
    first and second power-on buffer stages connected respectively to the control terminals of the first and second power transistors;
    a first power-on detector connected between the first power transistor and the second power-on buffer stage; and
    a second power-on detector connected between the second power transistor and the first power-on buffer stage, the power-on detectors thereby preventing the power transistors from being turned on simultaneously;
    wherein the first power-on buffer stage includes:
       an output transistor coupled to the first power-on detector;
       a first current generator connected between the first voltage reference and
       a control terminal of the output transistor;
       a second current generator having a first conduction terminal coupled to the first voltage reference and a control terminal coupled to the control terminal of the output transistor;
       a link transistor connected between the first voltage reference and the control terminal of the output transistor; and
       a third current generator connected between the second voltage reference and a control terminal of the link transistor.

14. The driver circuit according to claim 13, wherein the first power-on buffer circuit includes a resistor connected between the control terminal of the output transistor and the second current generator.

15. The driver circuit according to claim 13, wherein the first power-on buffer stage includes a diode-connecyed transistor connected between a conduction terminal of the first current generator and the second voltage reference.

16. The driver circuit according to claim 13, wherein the first power-on buffer stage includes a diode-connected transistor connected between the second conduction terminal of the first current generator and the second voltage reference.

* * * * *

UNITED STATES PATENT AND TRADEMARK OFFICE
CERTIFICATE OF CORRECTION

PATENT NO. : 6,538,479 B2
DATED : March 25, 2003
INVENTOR(S) : Ignazio Bellomo et al.

Page 1 of 1

It is certified that error appears in the above-identified patent and that said Letters Patent is hereby corrected as shown below:

<u>Column 7,</u>
Lines 61 and 62, "current generator and damper" should read -- current generator and clamper --.

<u>Column 8,</u>
Lines 59 and 60, "a diode-connecyed transistor" should read as -- a diode-connected transistor --.
Line 63 to 65, "a diode-connected transistor connected between the second conduction terminal of the first current generator and the second voltage reference." should read as -- first and second biasing transistors coupled between the first voltage reference and the control terminal of the link transistor. --.

Signed and Sealed this

Nineteenth Day of August, 2003

JAMES E. ROGAN
*Director of the United States Patent and Trademark Office*